United States Patent [19]

Fujii

[11] Patent Number: 4,952,523

[45] Date of Patent: Aug. 28, 1990

[54] PROCESS FOR FABRICATING CHARGE-COUPLED DEVICE WITH REDUCED SURFACE STATE AT SEMICONDUCTOR-INSULATOR INTERFACE

[75] Inventor: Ichiro Fujii, Miho, Japan

[73] Assignee: Texas Instruments Incorporated, Dallas, Tex.

[21] Appl. No.: 331,701

[22] Filed: Mar. 31, 1989

Related U.S. Application Data

[60] Division of Ser. No. 240,394, Aug. 29, 1988, Pat. No. 4,872,043, which is a continuation of Ser. No. 867,842, May 27, 1986, abandoned.

[30] Foreign Application Priority Data

Jun. 21, 1985 [JP] Japan .................................. 60-136509

[51] Int. Cl.$^5$ .............. H01L 21/476.3; H01L 29/796; H01L 21/339
[52] U.S. Cl. ..................................... 437/53; 437/937; 437/941
[58] Field of Search ................. 437/53, 941, 241, 937; 357/24

[56] References Cited

U.S. PATENT DOCUMENTS

| | | | |
|---|---|---|---|
| 4,151,011 | 4/1979 | Mihashi et al. ........................ | 357/28 |
| 4,210,922 | 7/1980 | Shannon ................................. | 357/24 |
| 4,290,187 | 9/1981 | Stein ....................................... | 357/24 |
| 4,297,782 | 11/1981 | Ito .......................................... | 437/37 |
| 4,328,432 | 5/1982 | Yamazaki .............................. | 357/24 |
| 4,331,709 | 5/1982 | Risch et al. ........................... | 437/241 |
| 4,392,011 | 7/1983 | Pankove et al. ...................... | 357/63 |
| 4,447,272 | 5/1984 | Saks ....................................... | 357/24 |
| 4,485,315 | 11/1984 | Collet et al. ........................... | 357/30 |
| 4,679,212 | 7/1987 | Hynecek ............................... | 357/24 |
| 4,742,381 | 5/1988 | Fujii ...................................... | 357/24 |

FOREIGN PATENT DOCUMENTS

| | | |
|---|---|---|
| 53-75862 | 5/1978 | Japan . |
| 54-2070 | 9/1979 | Japan . |
| 2140202 | 11/1984 | United Kingdom ................ 437/941 |

OTHER PUBLICATIONS

Snow et al., Conf. Proc. Soc. Photo-Optical Instrum. Engr., vol. 116, Solid State Imaging Dev. (1977), pp. 2-8.

*Primary Examiner*—Olik Chaudhuri
*Attorney, Agent, or Firm*—William E. Hiller; N. Rhys Merrett; Melvin Sharp

[57] ABSTRACT

To reduce the dark current to be produced in a semiconductor charge-coupled device, the device is fabricated by preparing a layer of a doped semiconductor having an insulator layer thereon, forming a plurality of transfer electrodes on said insulator layer, and reducing the surface state at the interface between said semiconductor layer and said insulator layer at least over its areas underlying the transfer electrodes.

18 Claims, 7 Drawing Sheets

PROCESS FOR FABRICATING CHARGE-COUPLED DEVICE WITH REDUCED SURFACE STATE AT SEMICONDUCTOR-INSULATOR INTERFACE

This is a division of application Ser. No. 240,394, filed Aug. 29, 1988, now U.S. Pat. No. 4,872,043 issued Oct. 3, 1989 which is a continuation of original application Ser. No. 867,842 filed May 27, 1986, abandoned.

FIELD OF THE INVENTION

The present invention relates in general to semiconductor devices and, more particularly, to a process of fabricating an improved semiconductor charge-coupled device with a reduced dark current.

BACKGROUND OF THE INVENTION

Charge-coupled devices are broken down to two major categories depending upon the locations of the channel to be formed, including a category of surface-channel charge-coupled devices and a category of buried-channel charge-coupled devices. In terms of the driving scheme, on the other hand, there are charge-coupled devices of single-phase, two-phase, three-phase and four-phase designs. A charge-coupled device of any of these types and designs is essentially a functional device constituted by a MOS structure providing a built-in scanning function and capabilities of storing information. Such a device has its typical applications in image sensing arrays, analog delay devices, and digital filters, as is well known in the art. A charge-coupled device of the buried-channel type has carriers transferred at a certain depth in the silicon substrate, compared to a device of the surface-channel type. Buried-channel charge-coupled devices are generally recognized to excel over surface-channel devices for carrier transfer efficiency and dark current characteristics.

Charge-coupled devices of any of the types and designs presently known however tend to produce large dark currents. The fact is that devices of the buried-channel type have not been improved to such an extent that reduction of the dark current is satisfactory. The attempts which have thus far been made to reduce dark currents in charge-coupled devices include the use of intrinsic gettering for the creation of lattice defects in the silicon substrates and the use of extrinsic gettering by doping with heavy metals. None of these attempts have however proved successful. Where a charge-coupled device is used in an image sensing array, as is frequently the case, the dark current produced by the device impairs the color tones and contrast of the image reproduced and could not produce pictures with acceptable qualities.

It is, accordingly, an important object of the present invention to provide a process of fabricating an improved semiconductor charge-coupled device having a reduced dark current.

THE INVENTION

The present invention has been completed on the basis of the discovery of the fact that there does exist a certain correlation between the dark current to be produced in a charge-coupled device and the surface state at the silicon-silicon oxide interface, viz., the interface between the silicon substrate and the silicon dioxide layer on the substrate. It has thus been found that, on account of such a correlation, the dark current in a charge-coupled device can be significantly reduced by reducing the surface state at the silicon-silicon oxide interface either throughout the area of the interface or over selected areas of the interface.

In accordance with the present invention, there is provided a process of fabricating a semiconductor charge-coupled device, comprising (a) preparing a layer of a doped semiconductor having an insulator layer thereon, (b) forming a plurality of transfer electrodes on the insulator layer, and (c) reducing the surface state at the interface between the semiconductor layer and the insulator layer.

BRIEF DESCRIPTION OF THE DRAWINGS

The features and advantages of a process of fabricating a charge-coupled device in accordance with the present invention will be more clearly understood from the following description taken in conjunction with the accompanying drawings in which like reference numerals designate similar or corresponding structures, elements and regions and in which:

FIG. 11 is a fragmentary cross sectional view showing an example of the cross sectional configuration of

DESCRIPTION OF THE PREFERRED EMBODIMENTS

First Preferred Embodiment

Figure 1A:
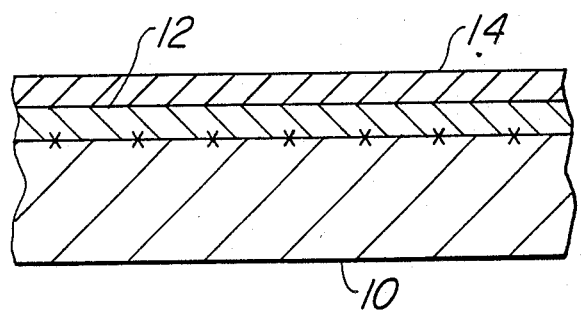
FIGS. 1A to 1C are fragmentary cross sectional views showing some of the successive steps for carrying out a first preferred embodiment of a process of fabricating a charge-coupled device in accordance with the present invention.

A first preferred embodiment of a process of fabricating a charge-coupled device in accordance with the present invention will now be described with reference to FIGS. 1A to 1C which show some of the successive steps for carrying out the process. Referring first to FIG. 1A, the first preferred embodiment of a process according to the present invention starts with preparation of a semiconductor substrate 10 of, for example, p-type silicon. The silicon substrate 10 has a silicon oxide film 12 which has been thermally oxidated or otherwise formed to an appropriate thickness to provide an insulator on the substrate 10. A layer 14 of heavily doped polysilicon layer is formed on the entire surface of the silicon oxide film 12 by, for example, chemical vapor deposition (CVD) techniques. The doped polysilicon layer 14 is then patterned and etched to leave a plurality of parallel strips (not shown) arranged at predetermined intervals to form electrodes including transfer and bias electrodes. At the point of time when the silicon oxide film 12 is formed on the silicon substrate 10, there is a surface state having a certain density at the interface between the substrate 10 and the oxide film 12 as schematically indicated by a series of x's in FIG. 1A.

Figure 1B:
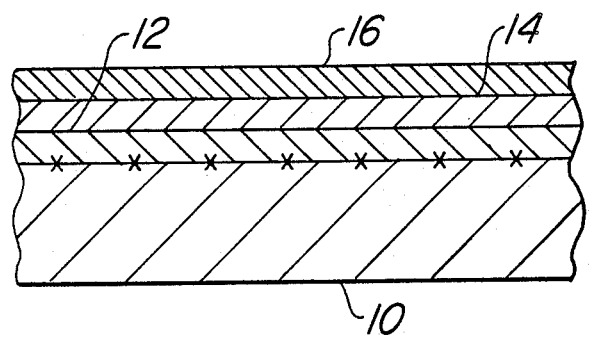

A film 16 of silicon nitride (particularly $Si_3N_4$) is then formed conformally on the resultant structure, viz., on the surface of the patterned doped polysilicon layer 14 and the exposed surface portions of the silicon oxide film 12 as will be seen from FIG. 1B. Plasma-enhanced chemical vapor deposition (PCVD) techniques are typically used for the formation of this silicon nitride film 16. For this purpose, gases of silane ($SiH_4$) and ammonia ($NH_3$) supplied at flow rates selected in the ratio of approximately 6 to 1 are reacted at a pressure of 2.0 Torr with an RF energy of about 600 watts to segregate plasma nitride. The mixture of the reactant gases contains a large quantity of hydrogen ions, which are introduced in high concentration (more than $1 \times 10^{22}$ atoms/cm$^3$) into the plasma-deposited nitride film 16 These hydrogen ions penetrate through the doped polysilicon layer 14 and the silicon oxide film 12 to reach the interface between the silicon oxide film 12 and the silicon substrate 10 and are allowed to bond to the dangling bonds present at the interface. It is considered that the hydrogen ions thus bonding to the dangling bonds contribute to significantly reducing the surface state at the silicon-silicon oxide interface. As a matter of fact, tests using a charge pumping method have revealed that the dangling bonds at the interface between the silicon substrate 10 and the silicon oxide film 12 are reduced to 10 per cent or less after the the silicon nitride film 16 has been formed on the slice.

Figure 1C:
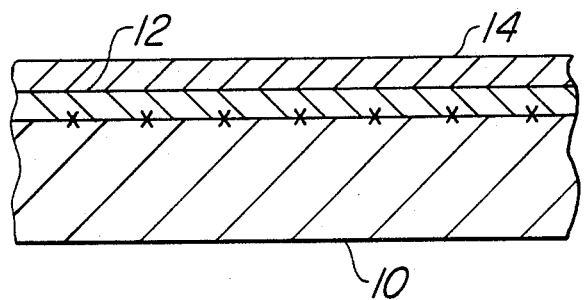

The silicon nitride film 16 is preferably etched away from the slice as shown in FIG. 1C after the surface state at the silicon-silicon oxide interface is thus reduced with the agency of the plasma nitride. If the silicon nitride film 16 is allowed to remain on the slice, there would be invited effects objectionable for the performance of the device to be used as, for example, an image sensing element. One of such objectionable effects results from the index of refraction of about 2.0 of the silicon nitride which absorbs blue-colored light.

A charge pumping method is used to determine the density of the surface state at the silicon-silicon oxide interface from the current which flows through the substrate 10 due to the recombination of holes and electrons. The measurement of such a current may be effected on a specimen of a MOS structure which has been processed to reduce the surface state at the silicon-silicon oxide interface of the structure. A common positive bias voltage is applied to both of the source and drain of the MOS structure with a bias voltage higher than the common bias voltage applied to the gate of the structure to collect electrons in the surface area of the silicon substrate below the gate. The gate bias voltage is thereafter shifted to a negative polarity to allow the collected electrons to recombine with the holes present in the silicon substrate. The current which thus flows through the silicon substrate as a result of the recombination of the holes and electrons is measured in an appropriate manner. As will be readily understood, the smaller such a regeneration current, the smaller the number of the electrons allowed to recombine with holes and, accordingly, the greater the reduction of the surface state at the silicon-silicon oxide interface will be. By using such a charge-pumping method, it has been found that the surface state at the silicon-silicon oxide interface of the MOS structure under consideration is reduced to less than one half after the interface is processed with plasma nitride. It has also been ascertained that the density of the electrons trapped at the surface of the silicon substrate is reduced by approximately 90 per cent after the silicon-silicon oxide interface is processed with the plasma nitride.

It has further proved that the dark current produced by the device fabricated as described with reference to FIGS. 1A to 1C is less than one half of the dark current produced in an ordinary charge-coupled device with the silicon-silicon oxide interface not processed with plasma nitride. The particular figure well matches the reduction of the surface state to less than 10 per cent or less as above noted. Thus, the formation of the silicon nitride film 16 with or without the subsequent removal of the film thus contributes to significant reduction of the dark current in the resultant charge-coupled device. A dark current is ordinarily measured oscilloscopically with the charge-coupled device shielded from external light.

Second Preferred Embodiment

Figure 2A:
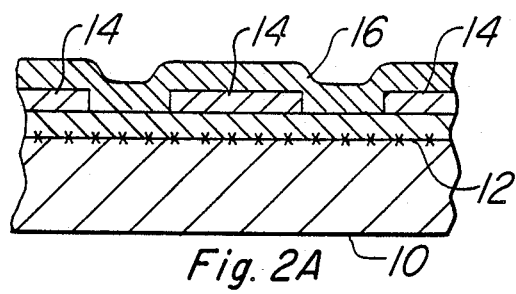
FIGS. 2A to 2D are fragmentary cross sectional views showing some of the successive steps for carrying out a second preferred embodiment of a process of fabricating a charge-coupled device in accordance with the present invention.

FIGS. 2A to 2D show some of the steps for carrying out a second preferred embodiment of a process according to the present invention. As shown in FIG. 2A, a semiconductor substrate 10 of, for example, p-type silicon with a silicon oxide film 12 formed at one surface thereof is also used in the second preferred embodiment of a process according to the present invention. As discussed in connection with the process shown in FIGS. 1A to 1C, a certain surface state is induced at the interface between the substrate 10 and the oxide film 12 at the point of time when the silicon oxide film 12' is formed on the silicon substrate 10 as indicated by a series of x's. A heavily doped polysilicon layer 14 is formed on the entire surface of the silicon oxide film 12 by, for example, chemical vapor deposition techniques. The doped polysilicon layer 14 is then patterned and etched to leave a plurality of parallel strips spaced apart at predetermined intervals to form electrodes including transfer and bias electrodes as shown.

Figure 2B:
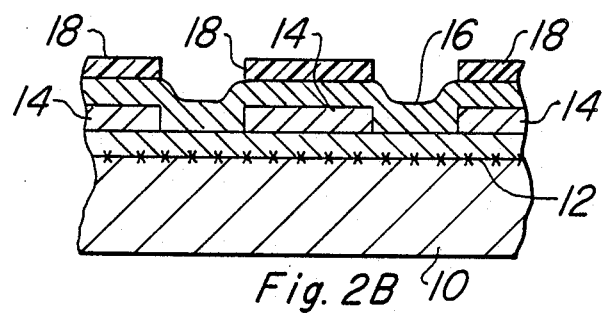
Figure 2C:
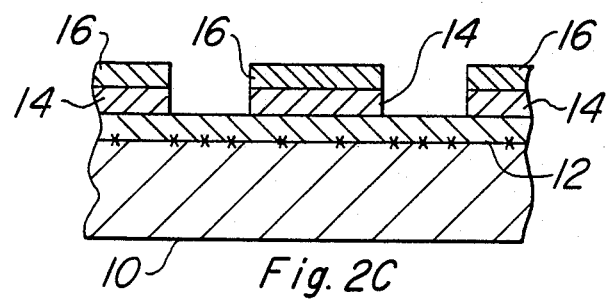

A film 16 of silicon nitride (Si3N4) is then formed conformally on the resultant structure by plasma-enhanced chemical vapor deposition techniques to cover the surface of the patterned doped polysilicon layer 14 and the exposed surface portions of the silicon oxide film 12 as will be seen from FIG. 2B. The chemical vapor deposition may be carried out under conditions similar to those used for the embodiment described with reference to FIGS. 1A to 1C. A suitable photoresist 18 is spun on to the surface of the patterned doped polysilicon later 14. The resist coating is selectively etched away to leave a photomask layer 18 in regions overlying the patterned doped polysilicon layer 14 across the silicon nitride film 16 as also shown in FIG. 2C. The silicon nitride film 16 is then etched with use of the photomask layer 18 to remove the nitride film 16 from those areas of the silicon oxide film 12 where the patterned doped polysilicon layer 14, is not present as shown in FIG. 2C. When the photomask layer 18 is stripped off, the patterned doped polysilicon layer 14 providing the transfer and bias electrodes is covered with the similarly patterned silicon nitride film 16 having edges substantially coincident with the edges of the polysilicon layer 14.

Figure 2D:
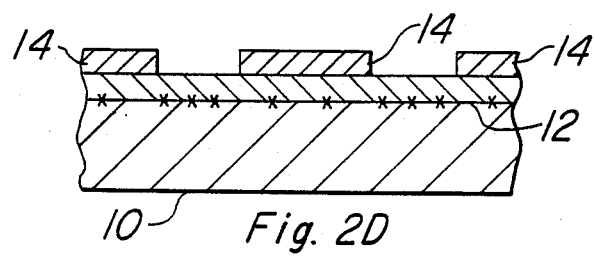

The resultant structure is annealed at 450° C. in nitride gas. The hydrogen ions which have penetrated far to the interface between the silicon substrate 10 and the silicon oxide film 12 during the preceding plasma-enhanced deposition process as previously discussed attempt to escape from the film 16 under the influence of the heat transferred to the film 16 during this annealing procedure. Such hydrogen ions are however inhibited from being freed from the silicon-silicon oxide interface over areas which underlie the patterned silicon nitride film 16 and are, for this reason, allowed to assuredly reach the silicon-silicon oxide interface over these particular areas. This results in significant reduction in the surface state at the interface between the silicon substrate 10 and the silicon oxide film 12. After the annealing step, the patterned silicon nitride film 16 is preferably totally etched away from the slice as shown in FIG. 2D. The second preferred embodiment of a process according to the present invention is characterized by the formation of the silicon nitride film 16 patterned to be in registry with the underlying patterned doped polysilicon layer 14 which provides the transfer and bias electrodes of the device. The surface state of the silicon-silicon oxide interface can thus be reduced selectively over those areas of the interface which are likely to be particularly affected by the dark current for which the surface state of the silicon-silicon oxide interface is responsible.

Third Preferred Embodiment

Figure 3A:
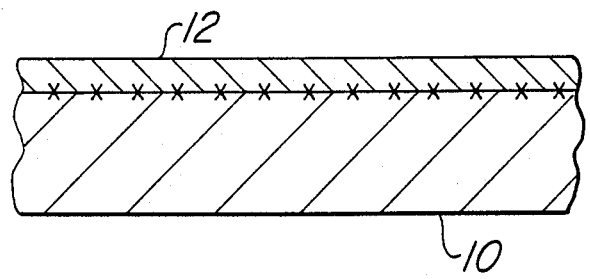
FIGS. 3A to 3C are fragmentary cross sectional views showing some of the successive steps for carrying out a third preferred embodiment of a process of fabricating a charge-coupled device in accordance with the present invention.
Figure 3B:
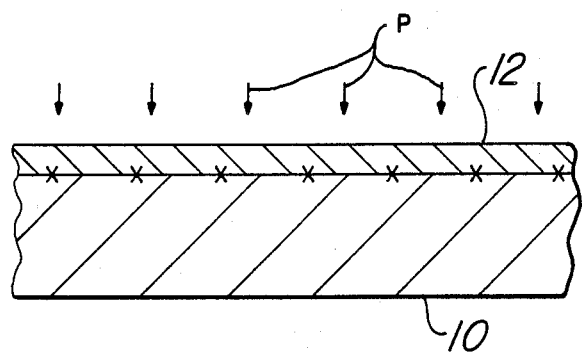
Figure 3C:
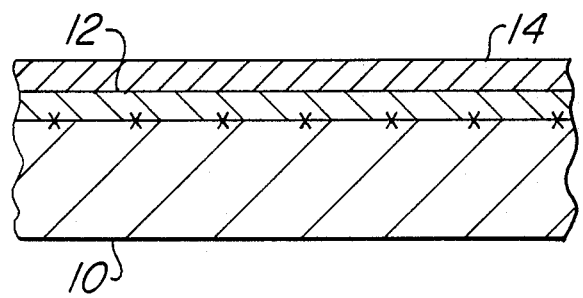

FIGS. 3A to 3C of the drawings show steps for carrying out a third preferred embodiment of a process according to the present invention. Also used in this embodiment is a semiconductor substrate 10 of, for example, p-type silicon with a silicon oxide film 12 formed at one surface thereof, as shown in FIG. 3A. A series of x's also indicates the surface state induced at the interface between the substrate 10 and the oxide film 12 when the silicon oxide film 12 is formed on the silicon substrate 10.

In the third preferred embodiment of a process according to the present invention, the silicon substrate 10 is placed in the atmosphere of plasma of, for example, the ions of an inert or neutral gas such as helium gas or the ions of silane gas as indicated by arrows P in FIG. 3B. The plasma ions are activated with application of an RF power of, for example, about 100 watts to about 200 watts per slice of 5 inch diameter so that the hydrogen ions contained in the plasma are caused to penetrate through the silicon oxide film 12 far to the interface between the silicon substrate 10 and the oxide film 12 and combine with the trap centers at the interface. This results in a significant decrease in the density of the surface state at the silicon-silicon oxide interface. In this connection it has been found that the surface state at the silicon-silicon oxide interface is reduced by approximately 20 per cent to about 30 per cent in terms of the trap density. After the treatment with the plasma ions, a heavily doped polysilicon layer 14 is formed on the entire surface of the silicon oxide film 12 by, for example, chemical vapor deposition techniques as shown in FIG. 3C. The doped polysilicon layer 14 is patterned and etched to leave a plurality of parallel strips spaced apart at predetermined intervals to form electrodes including transfer and bias electrodes as shown.

Figure 4:
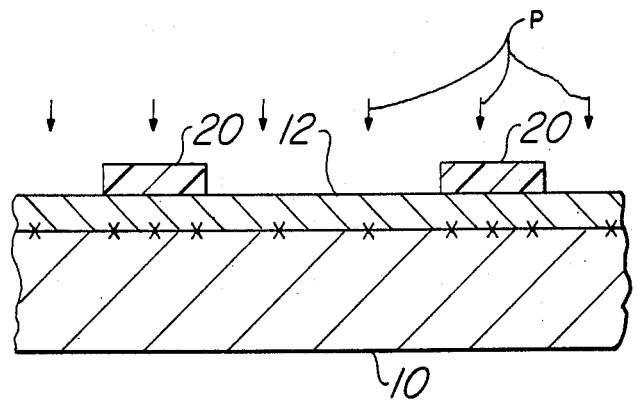
FIG. 4 is fragmentary cross sectional view showing one of the successive steps for carrying out a fourth preferred embodiment of a process of fabricating a charge-coupled device in accordance with the present invention.

While it has been assumed that the treatment with the plasma ions is effected throughout the area of the interface between the silicon substrate 10 and the silicon oxide film 12 in the third preferred embodiment of a process according to the present invention, such treatment may be performed over selected areas of the interface. FIG. 4 of the drawings shows a step to perform such localized treatment, the step forming part of a fourth preferred embodiment of a process according to the present invention.

Fourth Preferred Embodiment

Referring to FIG. 4, a silicon substrate 10 having a silicon oxide film 12 has a photoresist uniformly spun on to the entire surface of the silicon oxide film 12. The photoresist coating is patterned and etched to leave a photomask layer 20 covering selected areas of the silicon oxide film 12 as shown. The silicon substrate 10 is then placed in the atmosphere of plasma of, for example, suitable ions as indicated by arrows P. The plasma ions are activated with application of an RF power to cause the hydrogen ions in the plasma to penetrate through the silicon oxide film 12 to the interface between the silicon substrate 10 and the oxide film 12, thus giving rise to a significant decrease in the density of the surface state at the silicon-silicon oxide interface. The photomask layer 20 is then stripped from the silicon oxide film 12, and a heavily doped polysilicon layer is formed on the entire surface of the silicon oxide film 12 though not shown in FIG. 4. The doped polysilicon layer is patterned and etched to leave a plurality of parallel strips to form electrodes including transfer and bias electrodes on the selected areas of the silicon oxide film 12.

Fifth Preferred Embodiment

Figure 5A:
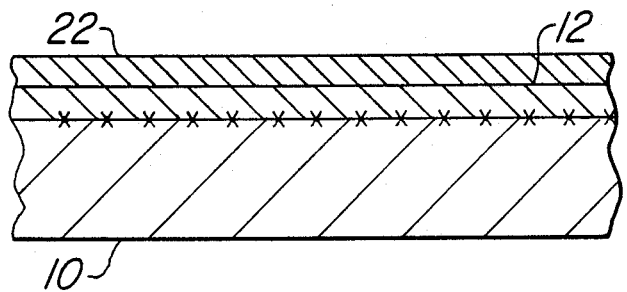
FIGS. 5A and 5B are fragmentary cross sectional views showing some of the steps for carrying out a fifth preferred embodiment of a process of fabricating a charge-coupled device in accordance with the present invention.
Figure 5B:
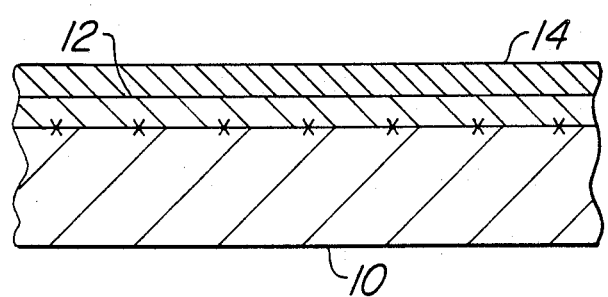

FIGS. 5A and 5B show steps for carrying out a fifth preferred embodiment of a process according to the present invention. As shown in FIG. 5A, a semiconductor substrate 10 of, for example, p-type silicon with a silicon oxide film 12 formed at one surface thereof is also used in the fifth preferred embodiment of a process according to the present invention. A metallized layer 22 of, for example, aluminum is deposited on the entire surface of the silicon oxide film 12 by, for example, vacuum deposition techniques. The resultant slice is subjected to an annealing process at a relatively low temperature of about 400° C. to about 500° C. for a predetermined period of time. As a result of this annealing process, the aluminum atoms in the metallized layer 22 are partially alloyed to a certain degree to the silicon atoms in the silicon oxide film 12 so that diffusion of aluminum atoms is initiated into the silicon oxide film 12. This results in reorganization of the atoms at the interface between the silicon oxide film 12 and the metallized layer 22 and the stress caused by such reorganization of the atoms acts to reduce the surface state at the interface between the silicon substrate 10 and the silicon oxide film 12. To achieve these effects, it is important to strictly control the temperature to be used for the annealing process so that the temperature falls within a predetermined range of between about 400° C. and about 500° C. If the annealing temperature happens to be lower than this predetermined range, then the annealing process could not be successful. If the annealing temperature exceeds the upper limit of the predetermined range, then the metallized layer 22 might be melted or formation of an aluminum-silicon alloy would result. It may be noted that the surface state at the interface between the silicon substrate 10 and the silicon oxide film 12 is reduced about 30 per cent to about 60 per cent in terms of the trap density as a result of the annealing process at a temperature within the specified predetermined range.

When the annealing process is complete, with reference to FIG. 5B, the metallized layer 22 of aluminum is totally etched away, whereupon a heavily doped polysilicon layer 14 is formed on the entire surface of the silicon oxide film 12 by, for example, chemical vapor deposition techniques. The doped polysilicon layer 14 is then patterned and etched to leave a plurality of parallel strips spaced apart at predetermined intervals to form electrodes including transfer and bias electrodes as shown.

If it is desired that the surface state at the interface between the silicon substrate 10 and the silicon oxide film 12 be reduced only over those areas of the interface which are to underlie the electrodes, the metallized layer 22 of aluminum which has been assumed to be formed throughout the surface of the silicon oxide film 12 may be patterned and etched accordingly. In this instance, aluminum atoms are allowed to diffuse into the silicon oxide film 12 merely over the areas of the oxide film 12 which are located below the patterned metallized layer 22 with the remaining areas of the silicon oxide film 12 maintained substantially intact. Such patterned metallized layer 22 is also etched away upon completion of the annealing process.

Figure 6:
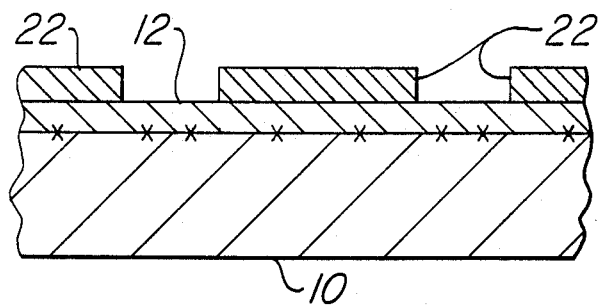
FIG. 6 is fragmentary cross sectional view showing one of the successive steps for carrying out a sixth preferred embodiment of a process of fabricating a charge-coupled device in accordance with the present invention.

Sixth Preferred Embodiment

Where a charge-coupled device according to the present invention is to be utilized in an electrically activated system such as, for example, the readout store section of an image sensing array, the transfer and bias electrodes to be provided in the device need not be constructed of optically transparent material such as polysilicon. In this instance, the electrodes formed of the doped polysilicon layer 14 in each of the embodiments hereinbefore described may be replaced by those of a metallized layer of, for example, aluminum. For this reason, the metallized layer 22 of aluminum used in the fifth preferred embodiment of a process according to the present invention may be allowed to remain on the silicon oxide film 12 for use as electrodes as shown in FIG. 6 after the annealing process using the particular layer 22.

Figure 7:
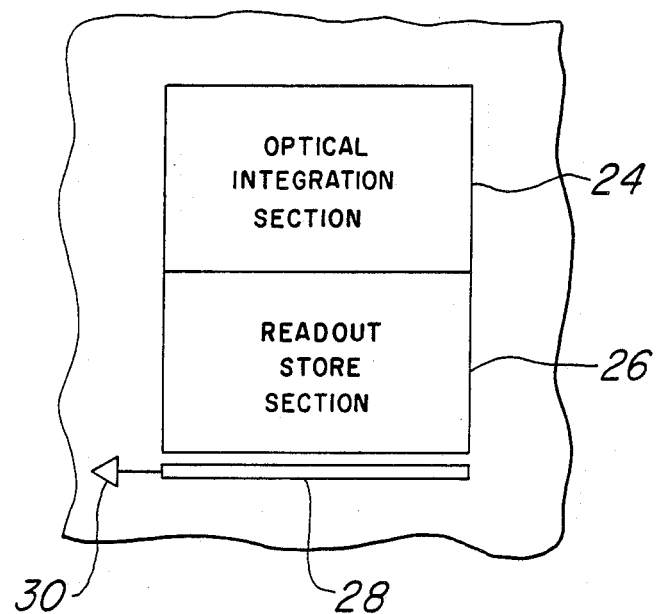
FIG. 7 is a fragmentary plan view schematically showing the general layout of a frame-transfer image sensing array.

While a charge-coupled device embodying the present invention may find a variety of potential applications, typical of such applications is an image sensing array. FIG. 7 of the drawings schematically shows the general layout of an image sensing array organized to operate in the "frame-transfer" mode. As well known in the art, an ordinary frame-transfer image sensing array largely consists of three functional sections. One of these functional sections is an optical integration section 24 onto which light is to be incident and in which the carriers generated by irradiation with the light are to be collected. Another functional section is an information readout store section 26 into which the whole frame of information is to be moved with all the electrodes pulsed at the end of the optical integration period. A third functional section of the image sensing array is a serial output register section 28 into which the information stored in the readout store section 26 is to be sequentially read and from which the information thus read out is to be horizontally transferred through an output diode (not shown) to an amplifier 30. Each of the optical integration section 24, readout store section 26 and output register section 28 is composed of a two-dimensional subarray of a myriad of charge-coupled devices of, for example, the buried channel type.

Figure 8:
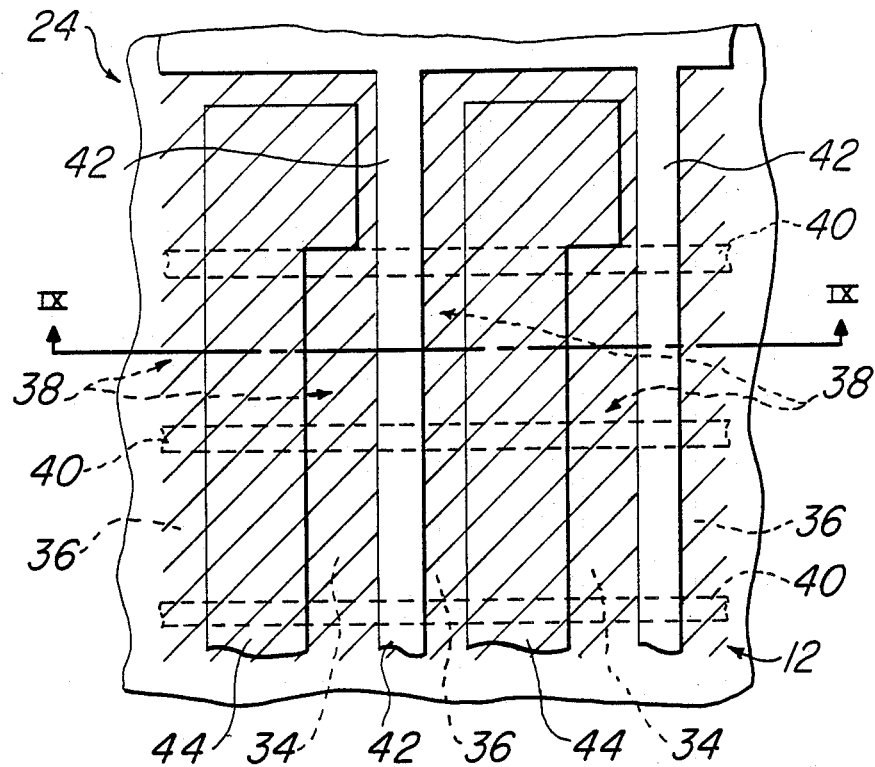
FIG. 8 is a fragmentary plan view showing, to an enlarged scale, a portion of the optical integration section which forms part of the image sensing array illustrated in FIG. 7.
Figure 9:
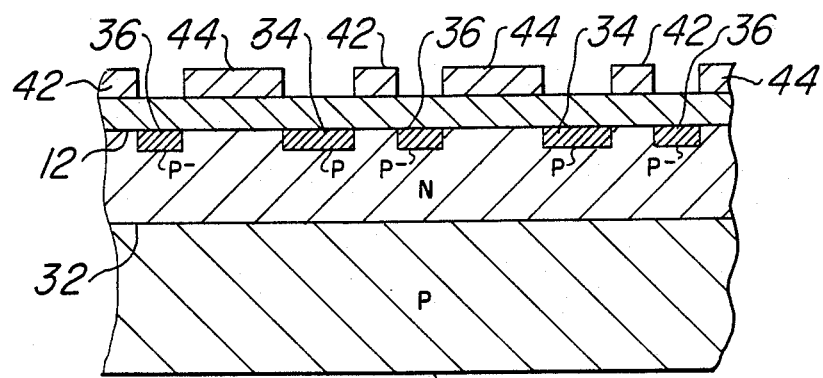
FIG. 9 is a cross sectional view taken along line IX—IX in FIG. 8.

FIGS. 8 and 9 of the drawings show the cross sectional configuration of a portion of the optical integration section 24 of the image sensing array thus constructed. The device herein shown is assumed to form part of a single-phase device known as a virtual-phase charge-coupled device.

The optical integration section 24 of the image sensing array as herein shown comprises a silicon substrate 10 of p-type silicon having an overlying n-type silicon layer 32 as will be better seen from FIG. 9. This n-type silicon layer 32 may be formed as a well in the silicon substrate 10 and is to provide a buried channel therethrough. The n-type silicon layer 32 is overlaid by a silicon oxide film 12. In the n-type silicon layer 32 are formed a plurality of first p-type silicon regions 34 and a plurality of second p-type silicon regions 36 which merge in plan with the first p-type silicon regions 34. The first and second p-type silicon regions 34 and 36 are appropriately spaced apart at predetermined intervals from each other and provide virtual electrode regions 38 as shown in FIG. 8. The first and second p-type silicon regions 34 and 36 are doped differentially, with the first p-type silicon regions 34 doped more heavily than the second p-type silicon regions 36 as indicated by "P" and "P$^-$" for the regions 34 and 36, respectively. Thus, the virtual electrode regions 38 formed by the first p-type silicon regions 34 are to build up in the n-type silicon layer 32 a predetermined potential higher than a predetermined potential to be built up in the n-type silicon layer 32 by the virtual electrode regions 38 formed by the second p-type silicon regions 36. The n-type silicon layer 32 also has formed therein a plurality of p$^+$-type channel stop regions 40 extending in directions perpendicular to directions of elongation of the p-type silicon regions 34 and 36 as indicated by broken lines in FIG. 8.

Treatment is effected to reduce the surface state of the interface between the silicon substrate 10 and the silicon oxide film 12 over selected areas of the interface. As will be readily seen from FIG. 8, these selected areas of the silicon-silicon oxide interface are exclusive of the areas of the interface which are located to intervene between each pair of the associated first and second p-type silicon regions 34 and 36. Thus, the surface state of the regions of the interface between the silicon substrate 10 and the silicon oxide film 12 which intervene between each pair of the associated first and second p-type silicon regions 34 and 36 is maintained unchanged On the silicon oxide film 12 is provided a plurality of electrodes of heavily doped polysilicon. These electrodes are shown including anti-blooming electrodes 42 located over the above mentioned areas of the interface which are located to intervene between each pair of the associated first and second p-type silicon regions 34 and 36. The electrodes on the silicon oxide film 12 further include transfer electrodes 44 which alternate with the individual anti-blooming electrodes 42. The anti-blooming electrodes 42 serve to take up excess carriers which may be produced in the channel in the n-type layer 32 during operation of the device. The treatment to reduce the surface state of the interface between the silicon substrate 10 and the silicon oxide film 12 is thus effected over those areas of the interface which are to underlie the transfer electrodes 44 and overlie the virtual electrodes 38. If desired, such treatment may be performed only over those areas of the interface which are to underlie the transfer electrodes 44.

Figure 10:
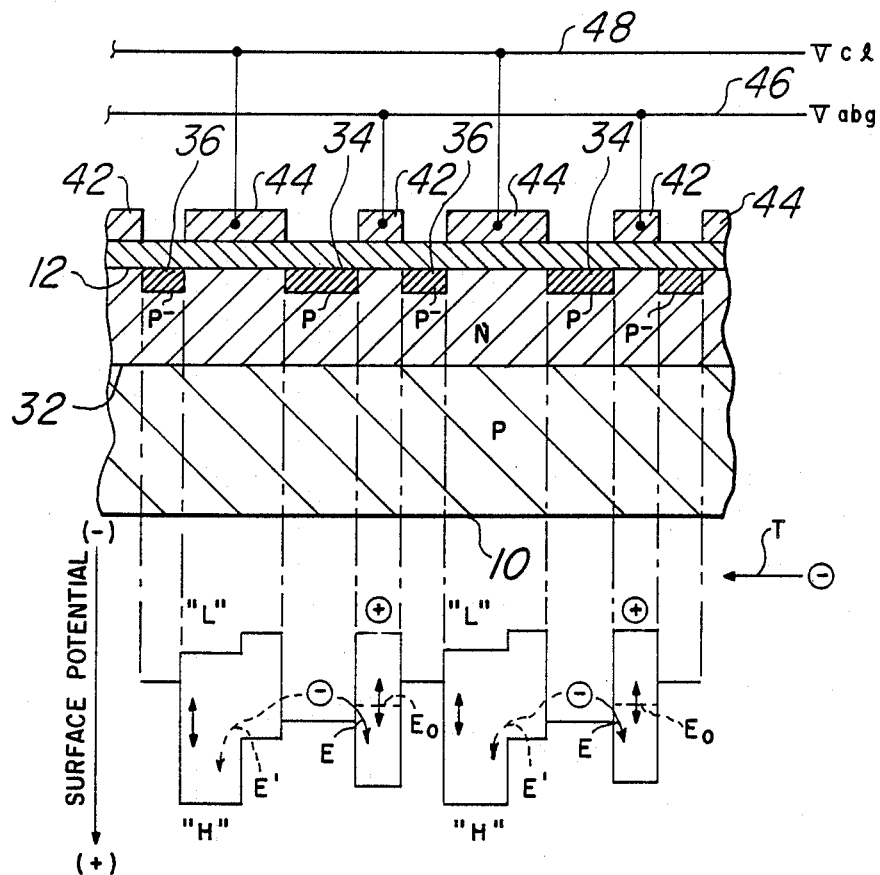
FIG. 10 is a view largely similar in part to FIG. 9 but additionally shows in its lower half section the distribution of the surface potentials of the channel-forming silicon layer which forms part of the device depicted in FIGS. 7 and 8.

Description will now be made in regard to the operation of the virtual-phase charge-coupled device configured as above described in the optical integration section 24 of the image sensing array, reference being had to FIGS. 7 and 9 and further to FIG. 10. The upper half of FIG. 10 is similar to FIG. 9 depicting the cross sectional configuration of the device portion of the integration section 24. The lower half of FIG. 10 shows the distribution of the surface potentials of the channel-forming n-type silicon layer 32, the surface potential being shown higher and positive downward and lower and negative upward. In the lower half of FIG. 10, electrons which are to act as majority carriers are indicated with a minus sign "−" enclosed in a bubble and holes which are generated by irradiation with light are indicated with a plus sign "+" enclosed in a bubble. The predetermined potentials to be built up by the first and second p-type silicon regions 34 and 36 are indicated by $E_1$ and $E_2$, respectively, in the lower half of FIG. 10). In the upper half of FIG. 10, the anti-blooming electrodes 42 are shown connected to a common clock line 46 leading from a source of clock pulses $V_{abg}$ and the transfer electrodes 44 shown connected to a common clock line 48 leading from a source of clock pulses $V_{cl}$. It is further assumed, by way of example, that electrons as the majority carriers are to be horizontally transferred through the n-type silicon layer 32 in the direction of arrow T in FIG. 10.

During an integration mode in which the optical integration section 24 is being irradiated with light, there are no clock pulses $V_{cl}$ applied to the transfer electrodes 44 to establish a low potential level "L" at the surface of the n-type silicon. On the other hand, the anti-blooming electrodes 42 are switched between high and low levels "H" and "L" by the clock pulses $V_{abg}$ applied to the electrodes through the line 46. As the potential level at the surface of the n-type silicon layer 32 thus swings to the high level "H" below the anti-blooming electrodes 42, the electrons located below the virtual electrodes 38, viz., first and second p-type silicon regions 34 and 36 are partially trapped in the high energy level regions created below the anti-blooming electrodes 42 as indicated by arrows E in the lower half of FIG. 10. When the potential level at the surface of the n-type silicon layer 32 thereafter shifts to the low level "L" below the anti-blooming electrodes 42, the trapped electrons recombine at the surface of the silicon layer 32 with the holes generated by the incident light and are caused to disappear. It therefore follows that a charge-pumping current flows through the n-type silicon layer 32 with an excess of electrons taken up or eliminated below the anti-blooming electrodes 42. This prevents an occurrence of halation that would otherwise be caused by the presence of excess carriers or electrons.

At the end of the integration mode, there are no clock pulses $V_{abg}$ applied to the anti-blooming electrodes 42 to establish at the surface of the n-type silicon 32 a certain intermediate potential level indicated by dotted lines Eo in the lower half of FIG. 10. The potential level Eo thus established by the anti-blooming electrodes 42 is assumed to be lower and higher than the potential levels $E_1$ and $E_2$ built up by the first and second p-type silicon regions 34 and 36, respectively. On the other hand, the transfer electrodes 44 are switched between high and low levels "H" and "L" by the clock pulses $V_{cl}$ applied to the electrodes through the line 48. In response to the high potential level "H" built up at the surface of the n-type silicon layer 32 below the transfer electrodes 44, the electrons located below the virtual electrodes 38 are moved to the high energy level regions now created below the transfer electrodes 44 as indicated by arrows E' in dotted lines in the lower half of FIG. 10. When the potential level at the surface of the n-type silicon layer 32 thereafter shifts to the low level "L" below the transfer electrodes 44, the electrons in each of the regions below the transfer electrodes 44 are caused to move in the direction of arrow T through the regions below the adjacent, viz., immediately left second p-type silicon region 36 and the associated anti-blooming electrode 44 to the region below the first p-type silicon region 34 ahead of the region below the next transfer electrode 44. The electrons thus transferred to the region below the first p-type silicon region 34 ahead of the region below the next transfer electrode 44 are moved to the high energy level region created below the particular transfer electrode 44 when the voltage applied to the electrode 44 thereafter shifts to the high level "H". It may be noted that each of the regions of the n-type silicon layer 32 which underlie the transfer electrodes 44 preferably provides different surface potential levels which are stepwise higher in the direction of arrow T in which electrons are to be transferred as will be seen from the lower half of FIG. 10. Such stepwise distribution of the surface potential in the regions of the n-type silicon layer 32 below the transfer electrodes 44 can be implemented by the use of differential doping for the silicon layer 32.

As will have been understood from the foregoing description, the surface state at the silicon-silicon oxide interface is reduced over its areas underlying the transfer electrons 44 and overlying the virtual electrodes 38. The surface state with such a reduced density lends itself to reduction of the dark current which results from the leakage of the carriers through the surface state during transfer of carriers through the channel in the n-type silicon layer 32. This enables the integration section 24 of the image sensing array to produce signals which faithfully correspond to the original image picked up by the section 24.

Figure 11:
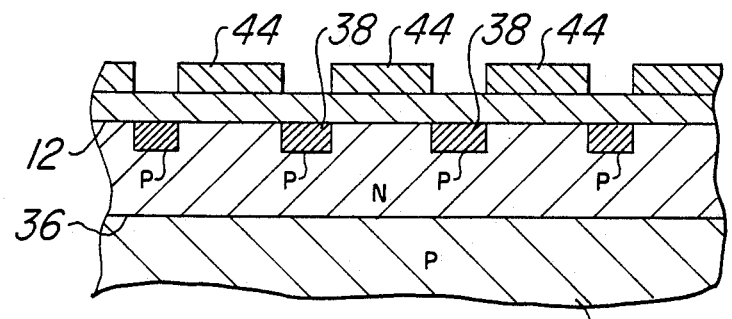

FIG. 11 of the drawings shows an example of the cross sectional configuration of the readout store section 26 of the image sensing array illustrated in FIG. 7. The readout store section 26 is herein shown configured similarly to the optical integration section 24 except that the anti-blooming electrodes 44 provided in the latter are dispensed with in the former. Each of the islands of the p-type regions which form the virtual electrodes 38 in the n-type silicon layer 32 is thus shown located to intervene between the regions of the layer 32 which underlie every adjacent two of the transfer electrodes 44. The transfer electrodes 44 for use in this readout store section 26 may be formed by a metallized layer of, for example, aluminum rather than doped polysilicon as used in the embodiment described with reference to FIG. 6.

While some preferred embodiments of a device according to the present invention and some preferred embodiments of a process of fabricating such a device in accordance with the present invention have thus far been described and shown, it should be borne in mind that such embodiments are simply illustrative of the gist of the present invention and are therefore subject to modification and change. Thus, the surface state of the silicon-silicon oxide interface may be reduced either throughout the area of the interface or only over selected areas of the interface as the case may be. Furthermore, the manner of reducing the surface state at the silicon-silicon oxide interface is not limited to those which have been used in the described embodiments. In the embodiment described with reference to FIGS. 3A to 3C, for example, the hydrogen ions to be injected into the substrate 10 may be supplied by forming the silicon oxide film 12 by chemical vapor deposition techniques under hydrogen-rich conditions. These hydrogen ions are allowed to reach the interface between the substrate 10 and the silicon oxide film 12 and to bond to the dangling bonds at the interface. It will be further apparent that the materials which have been specified for the various layers of the described embodiments may be replaced by any other appropriate substances and/or may be doped to conductivity types opposite to those which have been specified. Although, furthermore, the charge-coupled device shown in FIGS. 8 and 9 has been assumed to be of the buried-channel single-phase driven type, a charge-coupled device according to the present invention or a charge-coupled device which may be fabricated by a process according to the present invention may be of the two-phase, three-phase or four-phase type and/or of the surface-channel design if desired.

What is claimed is:

1. A process of fabricating a semiconductor charge-coupled device with a reduced surface state at the interface between a semiconductor substrate and an insulation layer disposed thereon of the charge-coupled device, said process comprising:
   providing ma doped semiconductor substrate having an insulation layer disposed thereon and defining a semiconductor-insulator interface therebetween;
   forming a plurality of spaced transfer electrodes on said insulation layer;
   exposing said transfer electrodes and surface portions of said insulation layer extending therebetween to a reactant gaseous atmosphere including silane and ammonia under conditions providing a high concentration of hydrogen ions;
   activating the reactant gaseous atmosphere by supplying RF energy thereto to produce hydrogen ion plasma and to deposit a nitride film on said transfer electrodes and surface portions of said insulation layer extending therebetween;
   selectively incorporating a multiplicity of hydrogen ions from the hydrogen ion plasma into said semiconductor substrate at a region adjacent to the top surface thereof and defining a hydrogen-rich portion of said semiconductor substrate disposed along at least a portion of said semiconductor-insulator interface in response to the activation of the reactant gaseous atmosphere; and
   causing said hydrogen ions to combine with dangling bonds located along said at least a portion of said semiconductor-insulator interface, whereby at least a portion of said semiconductor-insulator interface is provided with a reduced surface state due to the hydrogen ion-dangling bond combinations such that the fabricated charge-coupled device has a reduced dark current by virtue of electron-hole recombination activity being limited along said at least a portion of said semiconductor-insulator interface.

2. A process as set forth in claim 1, wherein said multiplicity of hydrogen ions are caused to combine with dangling bonds located along said at least a portion of said semiconductor-insulator interface by annealing the charge-coupled device under fabrication at an elevated temperature to inhibit hydrogen ions from being released from the semiconductor-insulator interface in areas underlying the nitride film.

3. A process as set forth in claim 1, further including removing the nitride film from the spaced transfer electrodes and the portions of said insulation layer extending therebetween after said multiplicity of hydrogen ions are caused to combine with dangling bonds located along said at least a portion of said semiconductor-insulator interface.

4. A process as set forth in claim 1, wherein said plurality of transfer electrodes are formed by
   forming a conductive layer on said insulation layer;
   patterning said conductive layer; and
   selectively etching the patterned conductive layer to form said plurality of spaced transfer electrodes on said insulation layer.

5. A process as set forth in claim 1, wherein said doped semiconductor substrate is silicon of one type conductivity, said insulation layer is a silicon oxide film on said silicon substrate of one type conductivity, and said conductive layer is a doped polysilicon layer formed on said silicon oxide film.

6. A process as set forth in claim 5, wherein the nitride film deposited on said transfer electrodes and surface portions of said insulation layer extending therebetween by supplying RF energy to the reactant gaseous atmosphere is silicon nitride.

7. A process at set forth in claim 6, wherein said plurality of transfer electrodes are formed by
   forming the doped polysilicon layer on said silicon oxide film; and
   selectively etching the doped polysilicon layer to form said plurality of spaced transfer electrodes on said silicon oxide film;
   forming a photolithographic mask layer on said silicon nitride film prior to providing said at least a portion of said semiconductor-insulator interface with a reduced surface state;
   patterning said photolithographic mask layer to mask said silicon nitride film over areas substantially in registration with said transfer electrodes;

selectively etching away the unmasked portions of said silicon nitride film; and thereafter causing said multiplicity of hydrogen ions to combine with dangling bonds located along said at least a portion of said semiconductor-insulator interface coinciding with the remaining portions of said silicon nitride film and said transfer electrodes disposed therebeneath by annealing the charge-coupled device under fabrication at an elevated temperature to inhibit hydrogen ions from being released from the semiconductor-insulator interface in areas underlying the selectively etched silicon nitride film and the transfer electrodes therebeneath.

8. A process as set forth in claim 7, further including removing the selectively etched silicon nitride film from the spaced transfer electrodes after annealing the charge-coupled device under fabrication.

9. A process as set forth in claim 1, further including:

forming an anti-blooming electrode on said insulation layer disposed between adjacent transfer electrodes and in spaced relationship with respect thereto;

forming first and second doped semiconductors regions of the same conductivity type but having different dopant densities in said doped semiconductor substrate and disposed to define a portion in said insulation layer in substantial registration with said anti-blooming electrode; and thereafter exposing the resultant structure to the reactant gaseous atmosphere.

10. A process as set forth in claim 9, wherein said doped semiconductor substrate is doped to be of one conductivity type, and said first and second doped semiconductor region are doped to be of the other conductivity type.

11. A process as set forth in claim 10, wherein the surface state at the semiconductor-insulator interface is reduced over those areas of said semiconductor-insulator interface which are in registration with said transfer electrodes.

12. A process as set forth in claim 10, wherein the surface state at the semiconductor-insulator interface is reduced over those areas of said semiconductor-insulator interface in respective registration with said transfer electrodes and with said first and second doped semiconductor regions.

13. A process of fabricating a semiconductor charge-coupled device with a reduced surface state at the interface between a semiconductor substrate and an insulation layer disposed thereon of the charge-coupled device, said process comprising:

providing a doped semiconductor substrate having an insulation layer disposed thereon and defining a semiconductor-insulator interface therebetween;

exposing the surface of said insulation layer to a reactant gaseous atmosphere including silane and ammonia under conditions providing a high concentration of hydrogen ions;

activating the reactant gaseous atmosphere by supplying RF energy thereto to produce hydrogen ion plasma and to deposit a nitride film on the surface of said insulation layer;

selectively incorporating a multiplicity of hydrogen ions from the hydrogen ion plasma into said semiconductor substrate at a region adjacent to the top surface thereof and defining a hydrogen-rich portion of said semiconductor substrate disposed along said semiconductor-insulator interface in response to the activation of the reactant gaseous atmosphere;

causing said hydrogen ions to combine with dangling bonds located along said semiconductor-insulator interface to provide said semiconductor-insulator interface with a reduced surface state due to the hydrogen ion-dangling bond combinations such that electron-hole recombination activity along said semiconductor-insulator interface is limited; and forming a plurality of spaced transfer electrodes on said insulation layer.

14. A process as set forth in claim 13, further including forming a patterned photolithographic mask layer masking selected portions of the surface of said insulation layer prior to the exposure of the surface of said insulation layer to the reactant gaseous atmosphere; and thereafter activating the reactant gaseous atmosphere by supplying RF energy thereto to produce hydrogen ion plasma such that the selective incorporation of a multiplicity of hydrogen ions from the hydrogen ion plasma into said semiconductor substrate occurs only through the unmasked portions of said insulation layer so as to define hydrogen-rich portions of said semiconductor substrate disposed along the portions of said semiconductor-insulator interface corresponding to the unmasked portions of said insulation layer; and forming said plurality of spaced transfer electrodes on said unmasked portions of said insulation layer.

15. A process of fabricating a semiconductor charge-coupled device with a reduced surface state at the interface between a semiconductor substrate and an insulation layer disposed thereon of the charge-coupled device, said process comprising:

providing a doped semiconductor substrate having an insulation layer disposed thereon and defining a semiconductor-insulator interface therebetween;

forming a metallized layer on the surface of said insulation layer to provide a metal-insulator interface therebetween;

subjecting the resultant structure to an annealing procedure at a raised temperature;

alloying atoms of metal in the metallized layer with atoms of semiconductor material contained in said insulation layer in response to said annealing procedure;

diffusing metal atoms into the insulation layer as a consequence of alloying occurring between the metal atoms and the semiconductor atoms in the insulation layer to reorganize the atoms at the metal-insulator interface; and reducing the surface state at the semiconductor-insulator interface in response to reorganization of the atoms at the metal-insulator interface and the stress induced by such atom reorganization such that the fabricated charge-coupled device has a reduced dark current by virtue of electron-hole recombination activity being limited along said semiconductor-insulator interface.

16. A process as set forth in claim 15, wherein said metallized layer is aluminum and the temperature under which said annealing procedure is carried out is maintained within a range of 400° C. to 500° C.

17. A process as set forth in claim 15, further including removing the metallized layer from the insulation layer subsequent to the annealing procedure.

18. A process as set forth in claim 17, further including forming a conductive layer on said insulation layer after the removal of said metallized layer therefrom;
patterning said conductive layer; and
selectively etching the patterned conductive layer to form transfer electrodes for the charge-coupled device.

* * * * *